(12) United States Patent
Iwaki

(10) Patent No.: US 11,108,375 B2
(45) Date of Patent: Aug. 31, 2021

(54) ACOUSTIC WAVE DEVICE, METHOD OF FABRICATING THE SAME, FILTER, AND MULTIPLEXER

(71) Applicant: TAIYO YUDEN CO., LTD., Tokyo (JP)

(72) Inventor: Masafumi Iwaki, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 78 days.

(21) Appl. No.: 16/576,065

(22) Filed: Sep. 19, 2019

(65) Prior Publication Data

US 2020/0186122 A1 Jun. 11, 2020

(30) Foreign Application Priority Data

Dec. 5, 2018 (JP) .............................. JP2018-228005

(51) Int. Cl.
| | |
|---|---|
| *H03H 9/145* | (2006.01) |
| *H03H 9/25* | (2006.01) |
| *H03H 3/08* | (2006.01) |
| *H03H 9/72* | (2006.01) |
| *H03H 9/64* | (2006.01) |
| *H03H 9/02* | (2006.01) |

(52) U.S. Cl.
CPC .......... *H03H 9/14541* (2013.01); *H03H 3/08* (2013.01); *H03H 9/02897* (2013.01); *H03H 9/25* (2013.01); *H03H 9/6483* (2013.01); *H03H 9/725* (2013.01)

(58) Field of Classification Search
CPC ...... H03H 9/14541; H03H 3/08; H03H 9/725; H03H 9/25; H03H 9/6483; H03H 9/02897
USPC ................. 333/133, 186, 187, 188, 193–196
See application file for complete search history.

(56) References Cited

U.S. PATENT DOCUMENTS

| | | | |
|---|---|---|---|
| 5,061,870 A | 10/1991 | Leki et al. | 310/313 |
| 6,033,471 A | 3/2000 | Nakanishi et al. | 117/108 |
| 6,316,860 B1 | 11/2001 | Kimura et al. | 310/313 |
| 2004/0207485 A1* | 10/2004 | Kawachi | H03H 9/0585 333/133 |
| 2007/0176711 A1* | 8/2007 | Kando | H03H 9/14541 333/193 |

FOREIGN PATENT DOCUMENTS

| | | |
|---|---|---|
| JP | 62-295504 A | 12/1987 |
| JP | 5-183373 A | 7/1993 |
| JP | 5-199062 A | 8/1993 |
| JP | 6-13277 A | 5/1994 |
| JP | 6-350377 A | 12/1994 |
| JP | 7-170145 A | 7/1995 |
| JP | 7-307634 A | 11/1995 |
| JP | 9-199968 A | 7/1997 |
| JP | 2002-353767 A | 12/2002 |

* cited by examiner

*Primary Examiner* — Robert J Pascal
*Assistant Examiner* — Jorge L Salazar, Jr.
(74) *Attorney, Agent, or Firm* — Stein IP, LLC

(57) ABSTRACT

An acoustic wave device includes: a piezoelectric substrate; and a pair of comb-shaped electrodes located on the piezoelectric substrate, each of the comb-shaped electrodes being formed mainly of a monocrystalline metal film, each of the comb-shaped electrodes including electrode fingers.

11 Claims, 11 Drawing Sheets

ACOUSTIC WAVE DEVICE, METHOD OF FABRICATING THE SAME, FILTER, AND MULTIPLEXER

CROSS-REFERENCE TO RELATED APPLICATION

This application is based upon and claims the benefit of priority of the prior Japanese Patent Application No. 2018-228005, filed on Dec. 5, 2018, the entire contents of which are incorporated herein by reference.

FIELD

A certain aspect of the present invention relates to an acoustic wave device, a method of fabricating the same, a filter, and a multiplexer.

BACKGROUND

In high-frequency communication systems typified by mobile phones, high-frequency filters have been used to remove unnecessary signals other than signals in the frequency band used for communication. Acoustic wave devices including surface acoustic wave (SAW) elements have been used in the high-frequency filters. The surface acoustic wave element is an element in which an interdigital transducer (IDT) including a pair of comb-shaped electrodes is formed on a piezoelectric substrate such as a lithium tantalate ($LiTaO_3$) substrate or a lithium niobate ($LiNbO_3$) substrate, where lithium tantalate and lithium niobate are ferroelectric substances. A pair of comb-shaped electrodes excites a shear horizontal (SH) wave, a Rayleigh wave, or a boundary wave that is a type of the surface acoustic wave. To improve the power durability of the acoustic wave device, it has been known to use, as the comb-shaped electrode, an aluminum film to which impurities are added as disclosed in, for example, Japanese Patent Application Publication Nos. S62-295504 and H06-350377 (hereinafter, referred to as Patent Documents 1 and 2, respectively).

SUMMARY OF THE INVENTION

According to a first aspect of the present invention, there is provided an acoustic wave device including: a piezoelectric substrate; and a pair of comb-shaped electrodes located on the piezoelectric substrate, each of the comb-shaped electrodes being formed mainly of a monocrystalline metal film, each of the comb-shaped electrodes including electrode fingers.

According to a second aspect of the present invention, there is provided a filter including the above acoustic wave device.

According to a third aspect of the present invention, there is provided a multiplexer including the above filter.

According to a fourth aspect of the present invention, there is provided a method of fabricating an acoustic wave device, the method including: bonding a monocrystalline metal film on a piezoelectric substrate; and forming a pair of comb-shaped electrodes by patterning the monocrystalline metal film after the bonding of the monocrystalline metal film, each of the comb-shaped electrodes including electrode fingers.

DETAILED DESCRIPTION

Even when an aluminum film to which impurities are added is used as the comb-shaped electrode as described in Patent Documents 1 and 2, the power durability is insufficient. In addition, the technique disclosed in Patent Documents 1 and 2 is not applicable when a metal film other than the aluminum film is used as the comb-shaped electrode.

Hereinafter, with reference to the accompanying drawings, embodiments of the present disclosure will be described.

First Embodiment

Figure 1A:
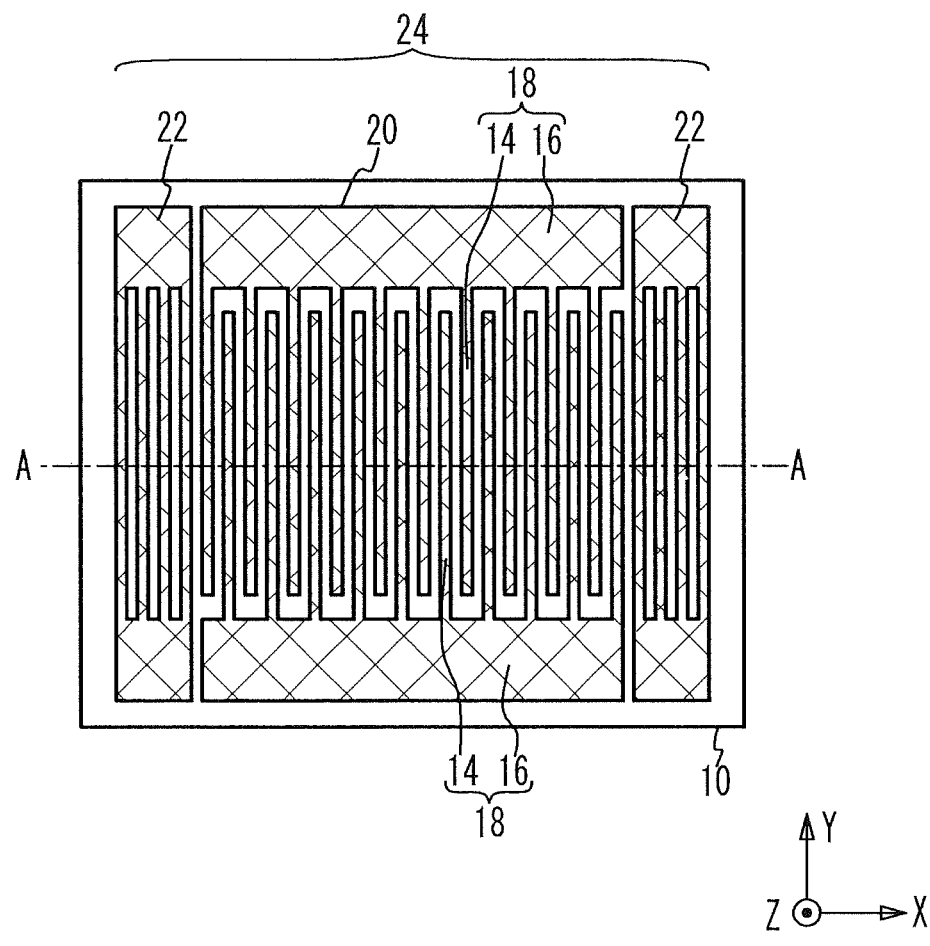
FIG. 1A is a plan view of an acoustic wave resonator in a first embodiment.
Figure 1B:
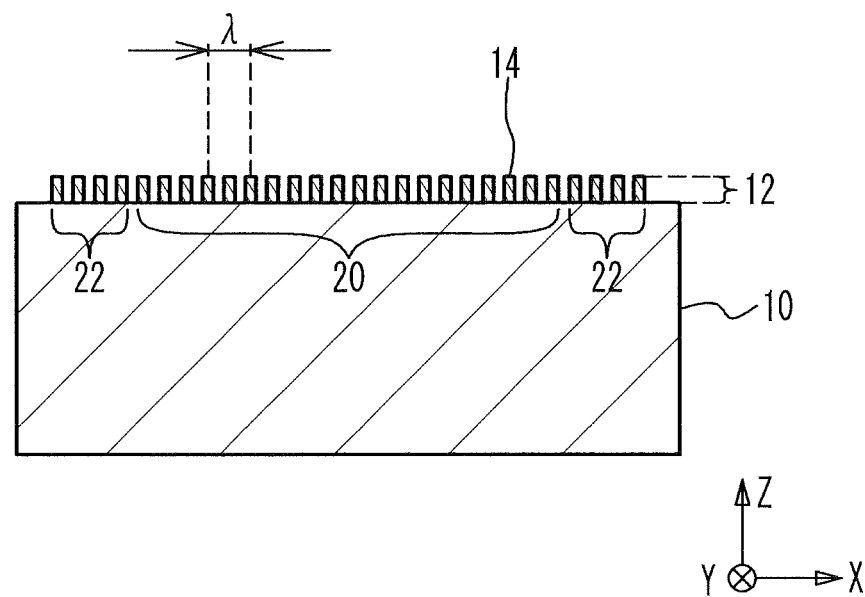
FIG. 1B is a cross-sectional view taken along line A-A in FIG. 1A.

An acoustic wave resonator will be described as an example of the acoustic wave device. FIG. 1A is a plan view of an acoustic wave resonator in a first embodiment, and FIG. 1B is a cross-sectional view taken along line A-A in FIG. 1A. The direction in which electrode fingers 14 are arranged is defined as an X direction, the direction in which the electrode finger 14 extends is defined as a Y direction, and a direction normal to a piezoelectric substrate 10 is defined as a Z direction. The X, Y, and Z directions do not necessarily correspond to the crystal orientations of the piezoelectric substrate 10 and a metal film 12.

As illustrated in FIG. 1A and FIG. 1B, an acoustic wave resonator 24 includes an IDT 20 and reflectors 22. The IDT 20 and the reflectors 22 are located on the piezoelectric substrate 10. The piezoelectric substrate 10 is a monocrystalline substrate such as, but not limited to, a lithium tantalate substrate, a lithium niobate substrate, or a crystal substrate, and is, for example, a monocrystalline rotated Y-cut X-propagation lithium tantalate substrate or a monocrystalline rotated Y-cut X-propagation lithium niobate substrate. In this case, the X direction corresponds to the X-axis orientation in the crystal orientation of the piezoelectric substrate 10.

The IDT 20 and the reflectors 22 are formed of the metal film 12. The metal film 12 is a metal film containing, as a main component, at least one of, for example, aluminum (Al), copper (Cu), molybdenum (Mo), titanium (Ti), chrome (Cr), gold (Au), iridium (Ir), platinum (Pt), rhenium (Re), rhodium (Rh), ruthenium (Ru), tantalum (Ta), and tungsten (W).

The IDT 20 includes a pair of comb-shaped electrodes 18. Each of the comb-shaped electrodes 18 includes the electrode fingers 14 and a bus bar 16 to which the electrode fingers 14 are coupled. The electrode fingers 14 of one of the comb-shaped electrodes 18 and the electrode fingers 14 of the other of the comb-shaped electrodes 18 are alternately arranged in at least a part of the IDT 20.

The reflectors 22 are formed at both sides of the IDT 20 in the X direction. The acoustic wave (for example, an SH wave, a Rayleigh wave, or a boundary wave) excited by the IDT 20 propagates mainly in the X direction, and the reflectors 22 reflect the acoustic wave. The pitch of the electrode fingers 14 of one of the comb-shaped electrodes 18 is represented by λ. Here, λ corresponds to the wavelength of the surface acoustic wave excited by the IDT 20. An insulating film such as, but not limited to, a silicon oxide film or a silicon nitride film may be provided so as to cover the metal film 12. The film thickness of the insulating film may be greater than or less than the film thickness of the metal film 12.

Figure 2A:
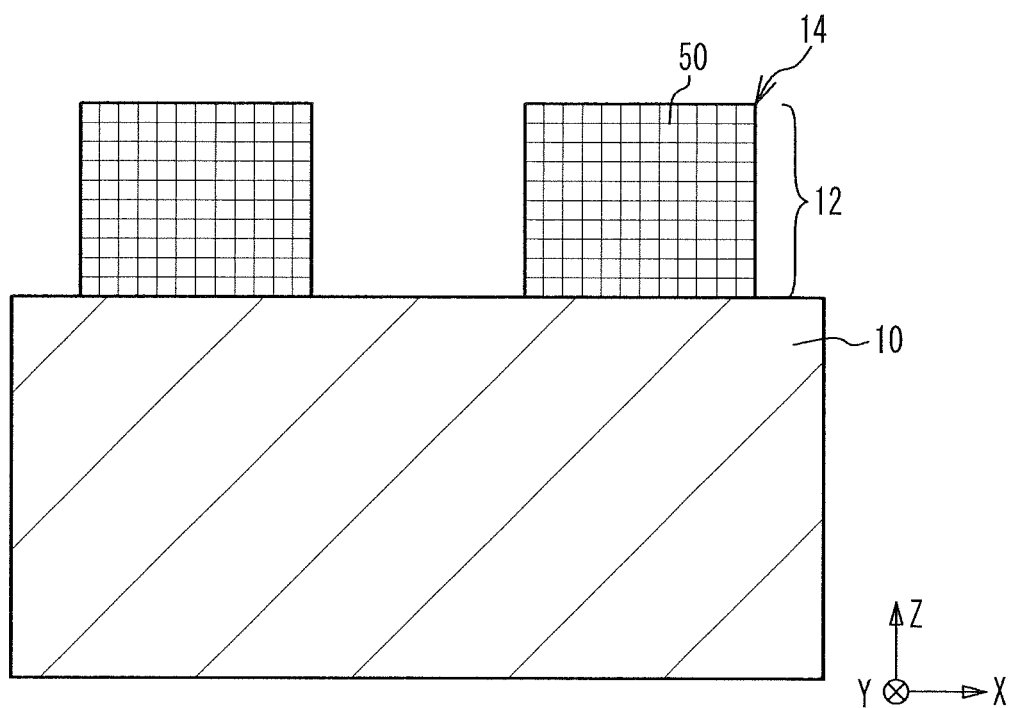
FIG. 2A and FIG. 2B are schematic cross-sectional views of acoustic wave resonators in accordance with the first embodiment and a first comparative example, respectively.
Figure 2B:
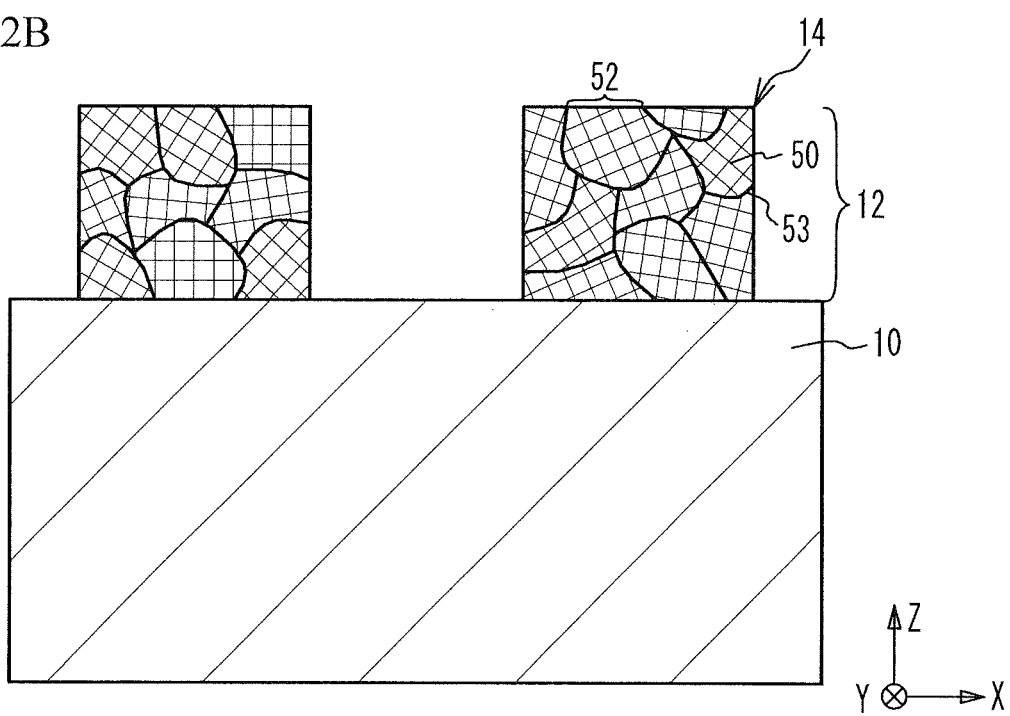

FIG. 2A and FIG. 2B are schematic cross-sectional views of acoustic wave resonators in accordance with the first embodiment and a first comparative example, respectively. The actual distance between crystal faces is very small, but FIG. 2A and FIG. 2B schematically illustrate crystal faces 50. The same applies the drawings hereinafter.

As illustrated in FIG. 2A, in the first embodiment, the metal film 12 is made of a monocrystalline metal having the crystal faces 50 oriented in the same direction. The crystal faces 50 are substantially parallel to the upper surface (i.e., the XY plane) of the piezoelectric substrate 10.

As illustrated in FIG. 2B, in the first comparative example, the metal film 12 has a polycrystalline structure containing a plurality of crystal grains 52. For example, when the metal film 12 is formed on the piezoelectric substrate 10 by vacuum evaporation or sputtering, the metal film 12 has a polycrystalline structure. A grain boundary 53 is formed between the crystal grains 52. The crystal faces 50 of the crystal grains 52 are oriented in various directions. In the grain boundary 53, the bonding strength between the crystal grains 52 is weak. Thus, when vibration or stress is applied to the electrode finger 14, the grain boundary 53 becomes a starting point for the electrode finger 14 to be broken. When a high-frequency signal with large electrical power is applied between a pair of the comb-shaped electrodes 18, the electrode finger 14 widely vibrates. Accordingly, the electrode finger 14 is easily broken from the grain boundary 53 as a starting point. Thus, the power durability is decreased.

In the first embodiment, as illustrated in FIG. 2A, the metal film 12 is a substantially uniform monocrystal having substantially no grain boundary 53. Thus, even when a high-frequency signal with large electrical power is applied between a pair of the comb-shaped electrodes 18 and the electrode finger 14 widely vibrates thereby, the electrode finger 14 is hardly broken because there is substantially no grain boundary 53 that becomes a starting point of breakage. Thus, the power durability is improved.

Figure 3A:
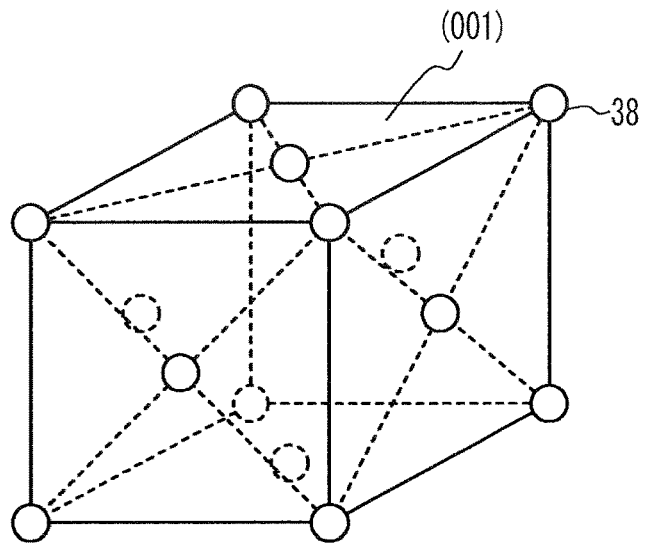
FIG. 3A through FIG. 3C are perspective views illustrating crystal structures of a monocrystalline metal film.
Figure 3B:
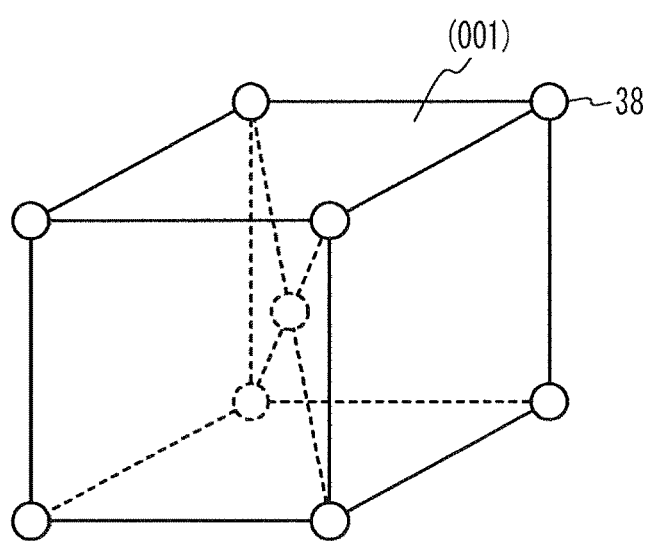
Figure 3C:
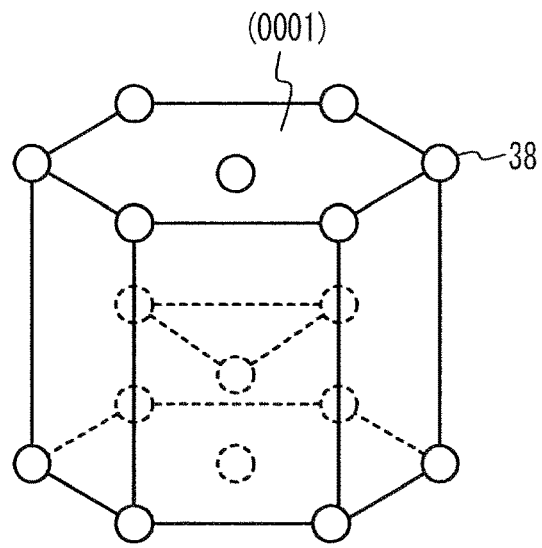

FIG. 3A through FIG. 3C are perspective views illustrating crystal structures of a monocrystalline metal film. FIG. 3A illustrates a body-centered cubic lattice (bcc) structure, FIG. 3B illustrates a face-centered cubic lattice (fcc) structure, and FIG. 3C illustrates a hexagonal close-packed (hcp) structure. FIG. 3A through FIG. 3C illustrate configurations of atoms 38.

The crystal structure of molybdenum is the bcc structure illustrated in FIG. 3A. The upper surface is the (001) plane. The crystal structures of aluminum, copper, platinum, and rhodium are the fcc structures illustrated in FIG. 3B. The upper surface is the (001) plane. The crystal structures of ruthenium and titanium are the hcp structures illustrated in FIG. 3C. The upper surface is the (0001) plane.

The crystal face of the metal film 12 to be bonded to the piezoelectric substrate 10 may be any plane, and may be, for example, the (001) plane when the crystal structure of the metal film 12 is the bcc structure or the fcc structure, and may be the (0001) plane when the crystal structure of the metal film 12 is the hcp structure. In the bcc structure and the fcc structure, the (001) plane is equivalent to the (100) plane and the (010) plane.

Fabrication Method of the First Embodiment

Figure 4A:
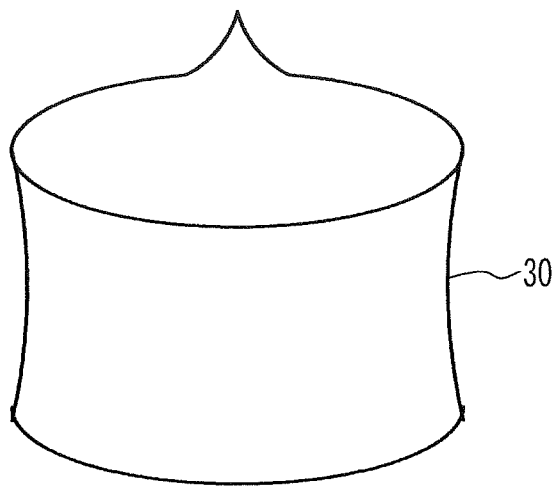
FIG. 4A through FIG. 4C are perspective views illustrating a method of fabricating the acoustic wave resonator in accordance with the first embodiment.
Figure 4B:
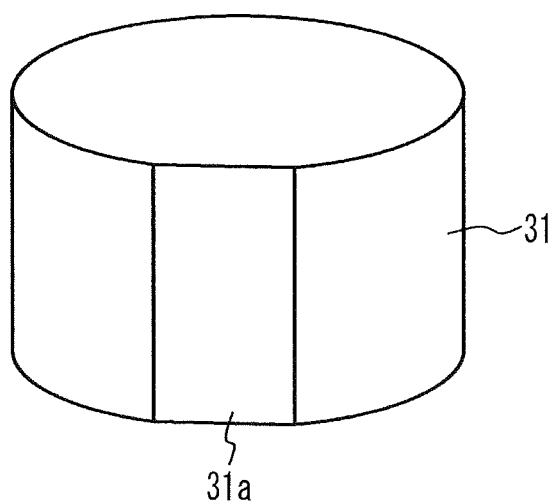
Figure 4C:
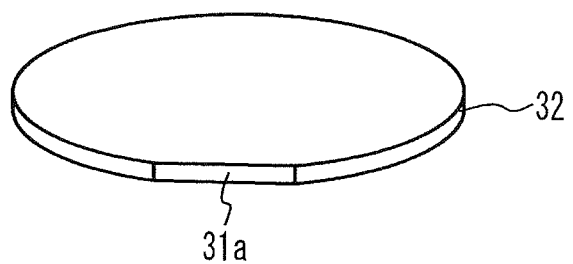

FIG. 4A through FIG. 4C are perspective views illustrating a method of fabricating the acoustic wave resonator in accordance with the first embodiment. FIG. 5A through FIG. 6C are cross-sectional views illustrating the method of fabricating the acoustic wave resonator in accordance with the first embodiment.

As illustrated in FIG. 4A, a monocrystalline metal ingot 30 is formed by, for example, the Czochralski method. The monocrystalline metal ingot 30 may be formed by a method other than the Czochralski method. As illustrated in FIG. 4B, the monocrystalline metal ingot 30 is processed into a cylindrical ingot 31. An orientation flat 31a is formed in accordance with the crystal orientation. As illustrated in FIG. 4C, the ingot 31 is cut with use of, for example, a wire saw to form a metal substrate 32 in a wafer shape. The metal substrate 32 is processed so as to have a desired thickness and a flat surface by polishing or chemical mechanical polishing (CMP).

Figure 5A:
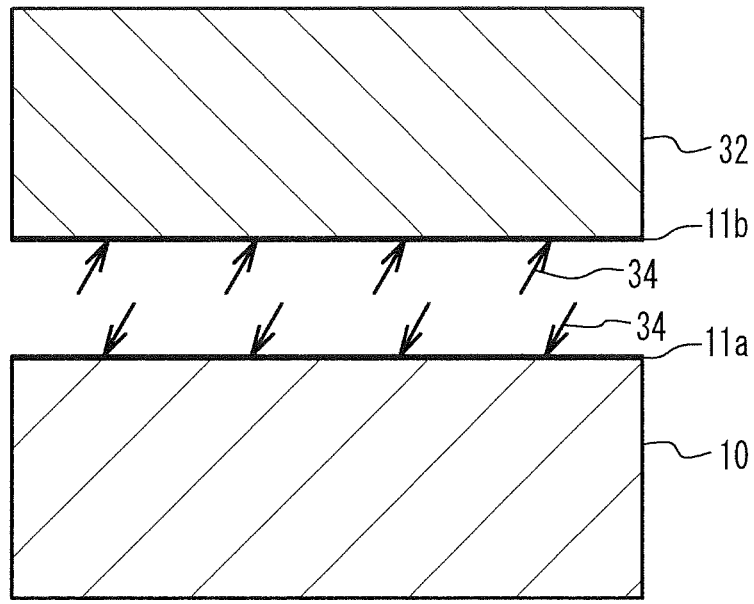
FIG. 5A through FIG. 5C are cross-sectional views (No. 1) illustrating a method of fabricating the acoustic wave resonator in accordance with the first embodiment.

As illustrated in FIG. 5A, in a vacuum, the lower surface of the metal substrate 32 and the upper surface of the piezoelectric substrate 10 are irradiated with ions 34 as an ion beam, a neutralized beam, or plasma. The ions 34 are ions of an inert element (e.g., noble gases) such as, but not limited to, argon (Ar) ions. When the ions 34 are emitted as an ion beam, an ion gun is used. When the ions 34 are emitted as neutralized atoms, a fast atom beam (FAB) gun is used. Through this process, the upper surface of the piezoelectric substrate 10 and the lower surface of the metal substrate 32 are activated.

An amorphous layer 11a containing, as a main component, the constituent element of the piezoelectric substrate 10 is formed on the upper surface of the piezoelectric substrate 10. An amorphous layer 11b containing, as a main component, the constituent element of the metal substrate 32 is formed on the lower surface of the metal substrate 32. For example, when the piezoelectric substrate 10 is a lithium tantalate substrate and the ions 34 are argon ions, the amorphous layer 11a contains tantalum, lithium, and oxygen as main components and contains argon. For example, when the metal substrate 32 is made of molybdenum and the ions 34 are argon ions, the amorphous layer 11b contains molybdenum as a main component and contains argon.

Figure 5B:
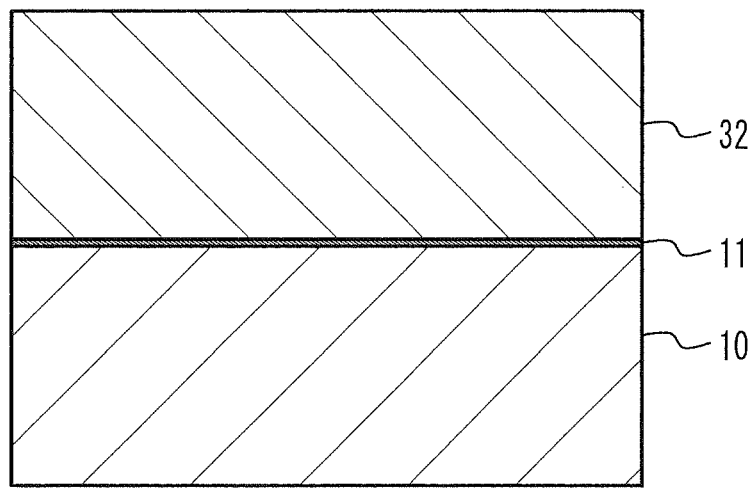

As illustrated in FIG. 5B, when the piezoelectric substrate 10 and the metal substrate 32 are attached to each other while a vacuum is maintained, the activated upper surface of the piezoelectric substrate 10 and the activated lower surface of the metal substrate 32 are bonded together. The bonding described above is conducted at normal temperature (for example, 100° C. or less and −20° C. or greater, preferably 80° C. or less and 0° C. or greater). Thus, thermal stress is reduced. An amorphous layer 11 is formed between the piezoelectric substrate 10 and the metal substrate 32.

Figure 5C:
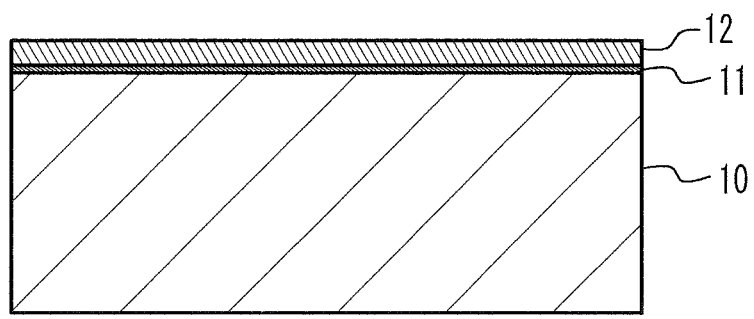

As illustrated in FIG. 5C, the metal substrate 32 is processed so as to have a desired thickness by polishing or CMP. This process forms the metal film 12 from the metal substrate 32. The metal film 12 has a thickness of, for example, 0.1λ.

Figure 6A:
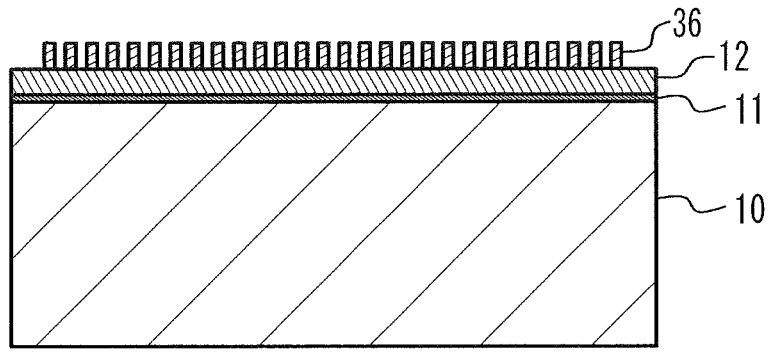
FIG. 6A through FIG. 6C are cross-sectional views (No. 2) illustrating the method of fabricating the acoustic wave resonator in accordance with the first embodiment.

As illustrated in FIG. 6A, a mask layer 36 is formed on the metal film 12. The mask layer 36 is, for example, photoresist, and is formed by photolithography. The mask layer 36 has a shape corresponding to the planar shapes of the IDT 20 and the reflectors 22.

Figure 6B:
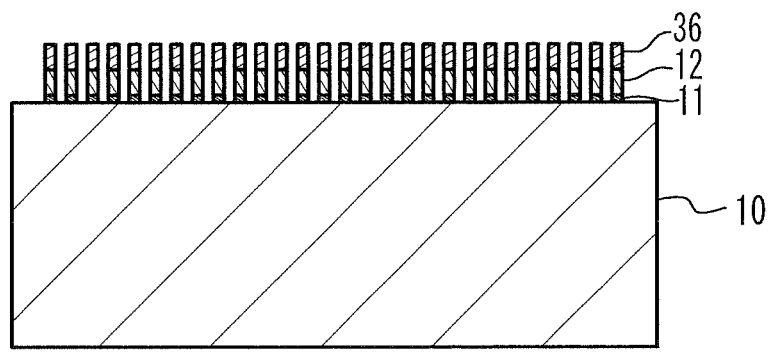
Figure 6C:
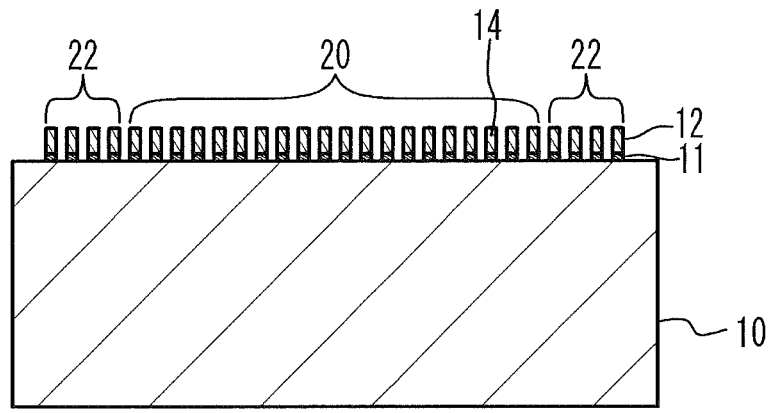

As illustrated in FIG. 6B, the metal film 12 is removed by, for example, dry etching using the mask layer 36 as a mask. As illustrated FIG. 6C, when the mask layer 36 is removed, the IDT 20 and the reflectors 22 made of the metal film 12 is formed on the piezoelectric substrate 10.

Figure 7A:
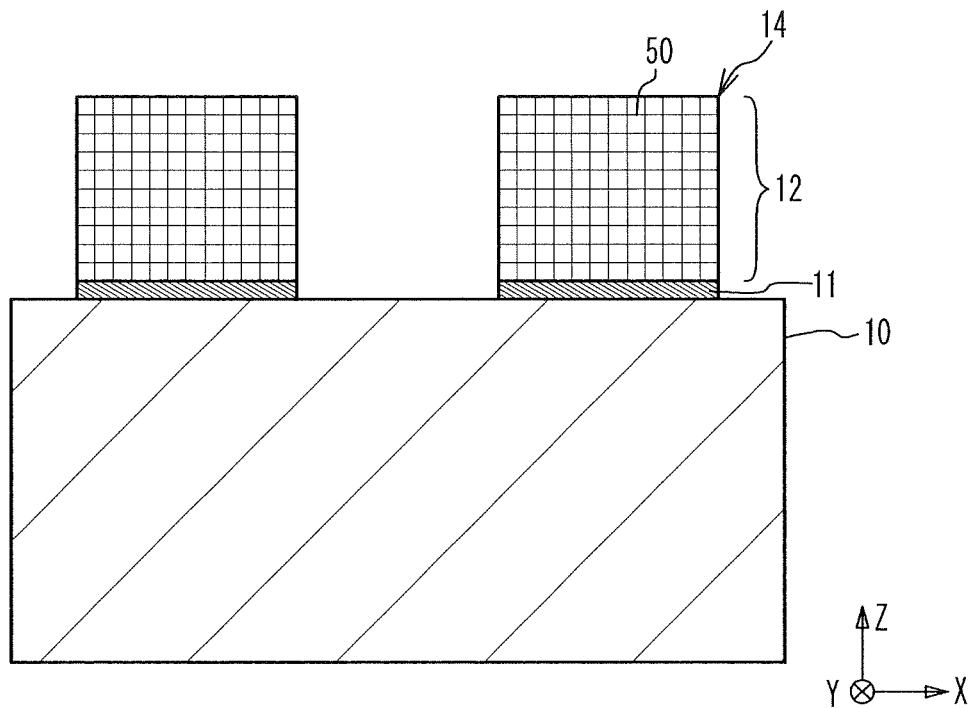
FIG. 7A and FIG. 7B are schematic cross-sectional views of acoustic wave resonators in accordance with the first embodiment and a first variation thereof, respectively.

FIG. 7A is a schematic cross-sectional view of the acoustic wave resonator in accordance with the first embodiment. As illustrated in FIG. 7A, the amorphous layer 11 may be located between the piezoelectric substrate 10 and the metal film 12. The amorphous layer 11 is formed by irradiating the upper surface of the piezoelectric substrate 10 and the lower surface of the metal substrate 32 with the ions 34 in FIG. 5A. The amorphous layer 11 contains, as a main component, the constituent element of at least one of the piezoelectric substrate 10 and the metal substrate 32, and contains the element of the ion 34. The amorphous layer 11 has a thickness of, for example, 1 nm to 10 nm. The amorphous layer 11 can be observed by transmission electron microscopy (TEM). For example, when the piezoelectric substrate 10 is monocrystalline, the amorphous layer 11 is sandwiched between the monocrystals, and thus can be observed by TEM. Depending on the irradiation method of the ions 34 or atoms, at least one of the amorphous layers 11a and 11b may be hardly formed.

First Variation of the First Embodiment

Figure 7B:
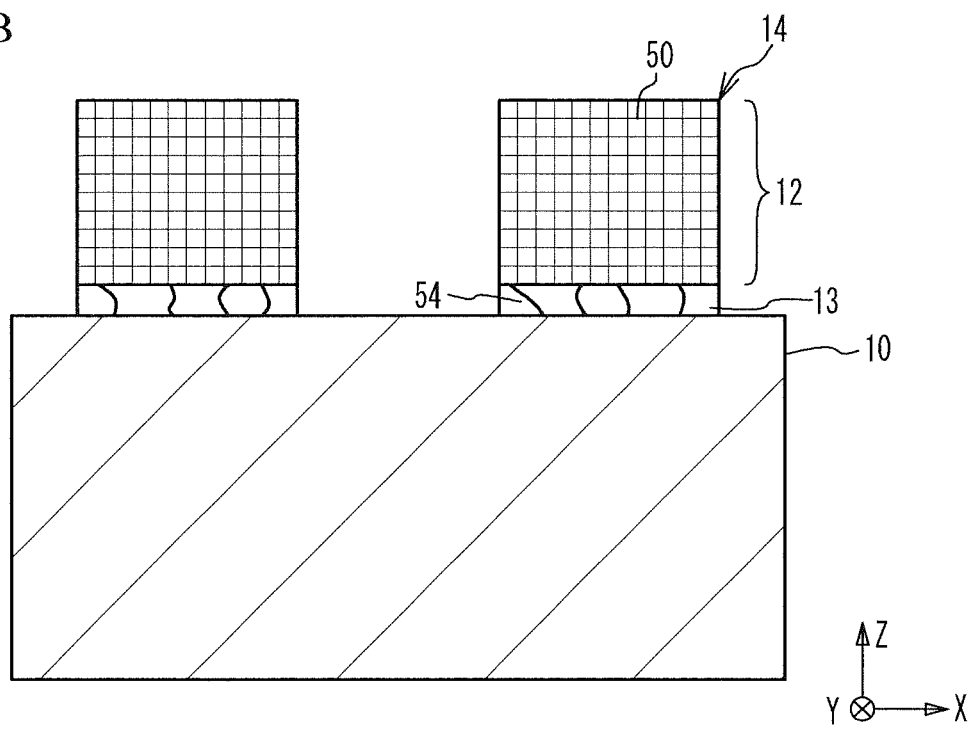

FIG. 7B is a schematic cross-sectional view of an acoustic wave resonator in accordance with a first variation of the first embodiment. As illustrated in FIG. 7B, a bonding film 13 is located between the piezoelectric substrate 10 and the metal film 12. The bonding film 13 has a polycrystalline structure containing a plurality of crystal grains 54 or an amorphous structure. The bonding film 13 is a metal film containing, as a main component, at least one of, for example, titanium, chrome, and nickel. The bonding film 13 has a film thickness of, for example, 10 nm to 100 nm. Other structures are the same as those of the first embodiment, and the description thereof is thus omitted.

Figure 8A:
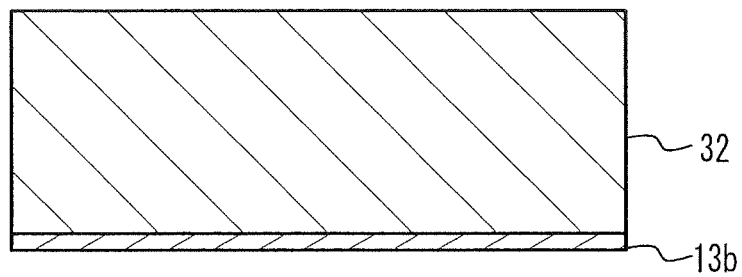
FIG. 8A and FIG. 8B are cross-sectional views illustrating a method of fabricating the acoustic wave resonator in accordance with the first variation of the first embodiment.
Figure 8A:
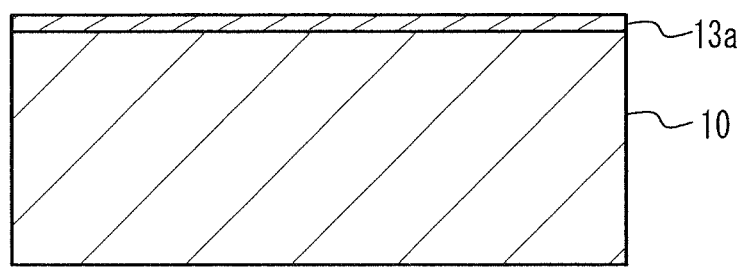
Figure 8B:
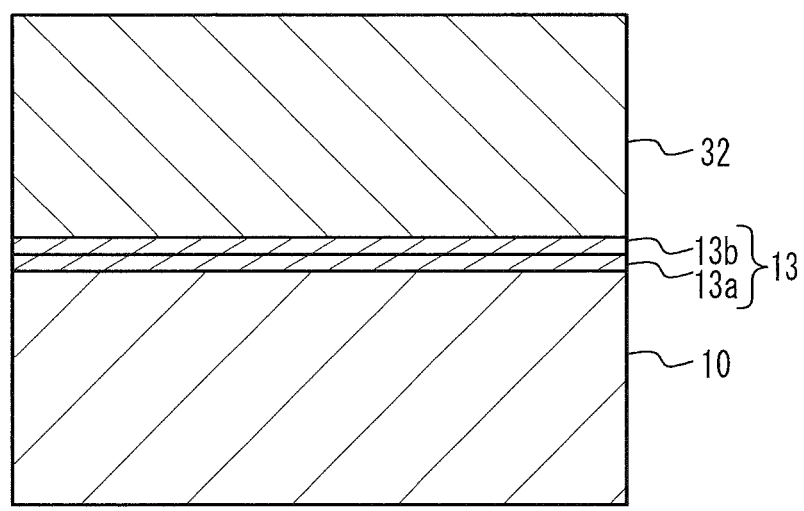

FIG. 8A and FIG. 8B are cross-sectional views illustrating a method of fabricating the acoustic wave resonator in accordance with the first variation of the first embodiment. As illustrated in FIG. 8A, after the steps illustrated in FIG. 4A through FIG. 4C in the first embodiment, a bonding film 13a is formed on the upper surface of the piezoelectric substrate 10, and a bonding film 13b is formed on the lower surface of the metal substrate 32. The bonding films 13a and 13b are formed by, for example, vacuum evaporation or sputtering. The bonding films 13a and 13b have a polycrystalline structure or an amorphous structure, and do not have a monocrystalline structure.

As illustrated in FIG. 8B, the bonding films 13a and 13b are bonded together. The bonding films 13a and 13b are integrated to form the bonding film 13. Through this process, the piezoelectric substrate 10 and the metal substrate 32 are bonded through the bonding film 13. The bonding films 13a and 13b are bonded by the surface activation method that irradiates the upper surface of the bonding film 13a and the lower surface of the bonding film 13b with ions or the like. The bonding films 13a and 13b may be bonded by heating and pressing the bonding films 13a and 13b. One of the bonding films 13a and 13b is not necessarily formed. Thereafter, the step illustrated in FIG. 5C and subsequent steps of the first embodiment will be executed.

Second Variation of the First Embodiment

Figure 9A:
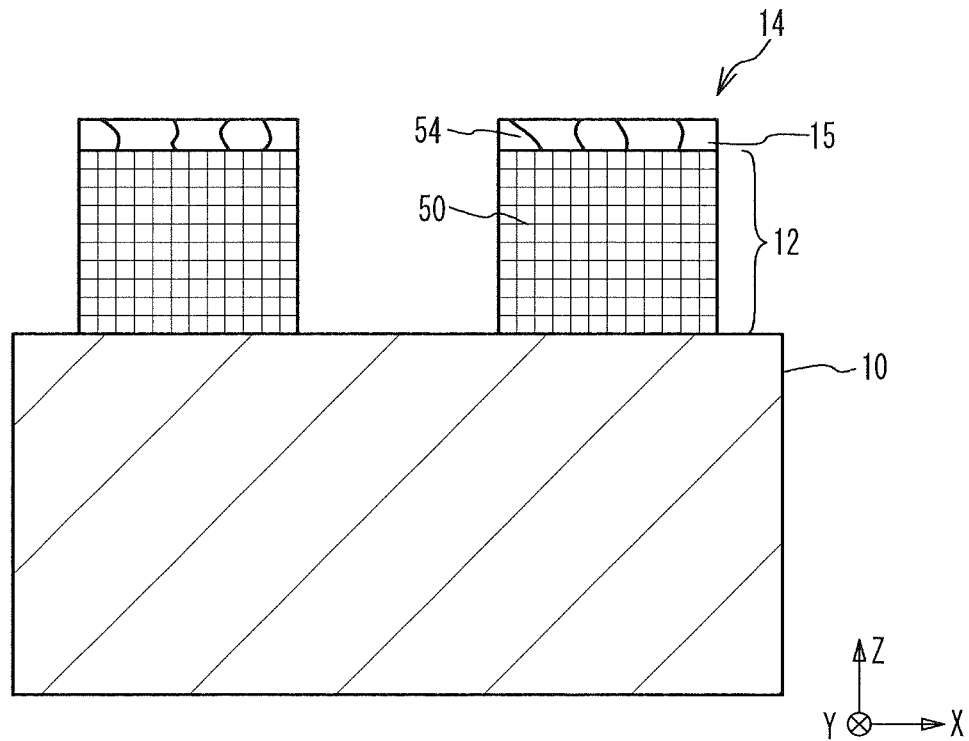
FIG. 9A and FIG. 9B are schematic cross-sectional views of acoustic wave resonators in accordance with second and third variations of the first embodiment, respectively.

FIG. 9A is a schematic cross-sectional view of an acoustic wave resonator in accordance with a second variation of the first embodiment. As illustrated in FIG. 9A, the electrode finger 14 may include a metal film 15 on the metal film 12. The metal film 15 is, for example, a protective film that protects the metal film 12, or a low-resistance film having a lower resistivity than the metal film 12. When the metal film 15 is a protective film, the metal film 15 contains, as a main component, at least one of, for example, titanium, chrome, and nickel. When the metal film 15 is a low-resistance film, the metal film 15 contains, as a main component, at least one of, for example, aluminum, gold, and copper. Other structures are the same as those of the first embodiment, and the description thereof is thus omitted.

The metal film 15 is formed on the metal film 12 in FIG. 5C. The metal film 15 is formed by, for example, vacuum evaporation or sputtering. The metal film 15 has a polycrystalline structure containing a plurality of the crystal grains 54 or an amorphous structure. The subsequent steps are the same as those of the first embodiment, and the description thereof is thus omitted. The metal film 15 has a film thickness of, for example, 10 nm to 100 nm. The bonding film 13 may be located between the piezoelectric substrate 10 and the metal film 12, and the metal film 15 may be located on the metal film 12.

Third Variation of the First Embodiment

Figure 9B:
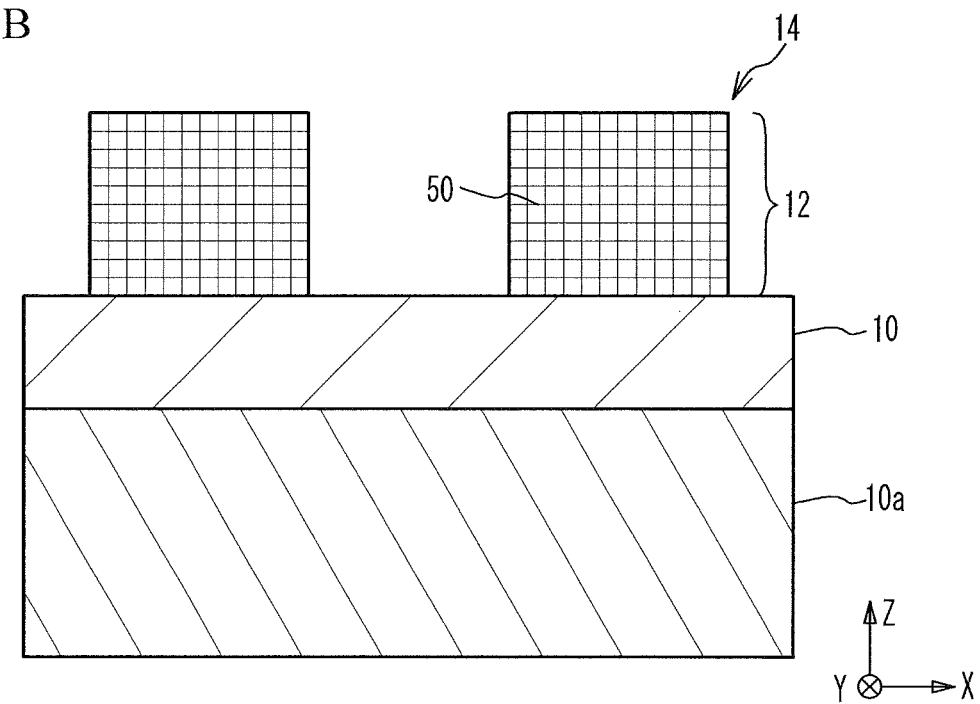

FIG. 9B is a schematic cross-sectional view of an acoustic wave resonator in accordance with a third variation of the first embodiment. As illustrated in FIG. 9B, the piezoelectric substrate 10 is bonded on a support substrate 10a. The support substrate 10a is, for example, a sapphire substrate, a spinel substrate, a silicon substrate, a crystal substrate, a quartz substrate, or an alumina substrate. The linear expansion coefficient of the support substrate 10a is less than the linear expansion coefficient of the piezoelectric substrate 10 in the X direction. Thus, the temperature coefficient of frequency of the acoustic wave resonator is reduced. The piezoelectric substrate 10 has a thickness of, for example, 10λ or less. To reduce spurious due to the bulk wave, the thickness of the piezoelectric substrate 10 is preferably 1λ or less. An insulating film made of silicon oxide or aluminum nitride may be located between the piezoelectric substrate 10 and the support substrate 10a. Other structures are the same as those of the first embodiment, and the description thereof is thus omitted.

Fourth Variation of the First Embodiment

Figure 10:
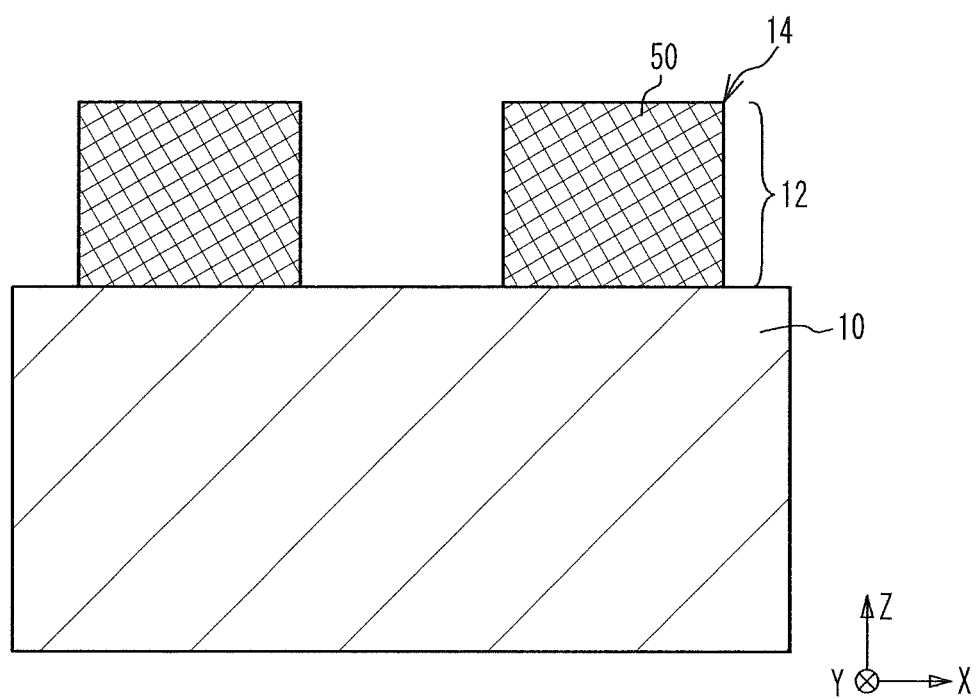
FIG. 10 is a schematic cross-sectional view of an acoustic wave resonator in accordance with a fourth variation of the first embodiment.

FIG. 10 is a schematic cross-sectional view of an acoustic wave resonator in accordance with a fourth variation of the first embodiment. As illustrated in FIG. 10, the bonding face in which the piezoelectric substrate 10 and the metal film 12 are bonded is inclined with respect to the crystal face 50. When the bonding face of the metal film 12 is the (001) plane or the (0001) plane as in the first embodiment, the main displacement of the oscillation of the surface acoustic wave is orthogonal to or parallel to the (001) plane or the (0001) plane. Thus, the metal film 12 is likely to be broken from the surface orthogonal to the (001) plane or the (0001) plane. In the fourth variation of the first embodiment, the bonding face of the metal film 12 is inclined with respect to the (001) plane or the (0001) plane. Thus, the main displacement of the oscillation of the surface acoustic wave is inclined with respect to the (001) plane or the (0001) plane. Accordingly, the breakage of the metal film 12 is inhibited, and the power durability to the application of high-frequency signal with large electrical power is improved. The bonding face of the metal film 12 is inclined preferably at an angle of 5° or greater and 85° or less, more preferably at an angle of 10° or greater and 80° or less, further preferably at an angle of 20° or greater and 70° or less with respect to the (001) plane or the (0001) plane. Other structures are the same as those of the first embodiment, and the description thereof is thus omitted.

In the first embodiment and the variations thereof, a pair of the comb-shaped electrodes 18 is formed mainly of the monocrystalline metal film 12. Accordingly, even when a high-frequency signal with large electrical power is applied between a pair of the comb-shaped electrodes 18, since the metal film 12 has substantially no grain boundary that becomes a starting point of breakage, the breakage of the metal film 12 is inhibited. Therefore, the power durability is improved.

The term "the comb-shaped electrode 18 is formed mainly of the monocrystalline metal film 12" means that the thickness of the monocrystalline metal film 12 is equal to or greater than 50% of the thickness of the comb-shaped electrode 18 when the comb-shaped electrode 18 is formed of a composite film in which metal films are stacked. This configuration improves the power durability. The thickness of the monocrystalline metal film 12 is preferably equal to or greater than 80% of the thickness of the comb-shaped electrode 18, more preferably equal to or greater than 90% of the thickness of the comb-shaped electrode 18.

In the method of fabricating the acoustic wave resonator, the monocrystalline metal film 12 is bonded on the piezoelectric substrate 10 as illustrated in FIG. 5A and FIG. 5B. Thereafter, as illustrated in FIG. 5C through FIG. 6C, a pair of the comb-shaped electrodes 18 each including the electrode fingers 14 is formed by patterning the monocrystalline metal film 12. Through these processes, a pair of the comb-shaped electrodes 18 including the monocrystalline metal film 12 is formed.

As illustrated in FIG. 5C, after the metal film 12 is bonded and before the comb-shaped electrode 18 is formed, the metal film 12 is thinned. This process makes the metal film 12 thin.

In the first variation of the first embodiment, provided is the bonding film 13 that is in contact with the monocrystalline metal film 12 and the piezoelectric substrate 10 and is located between the monocrystalline metal film 12 and the piezoelectric substrate 10. The bonding film 13 contains, as a main component, an element different from the constituent element of the monocrystalline metal film 12 and the constituent element of the piezoelectric substrate 10. Thus, the monocrystalline metal film 12 and the piezoelectric substrate 10 can be bonded together. The main component is a component excluding impurities added to improve the characteristics and unintended impurities, and the term "a film contains an element as a main component" means that the film contains for example, 50 atomic % or more of the element that is the main component.

In the first embodiment, provided is the amorphous layer 11 that is in contact with the monocrystalline metal film 12 and the piezoelectric substrate 10, is located between the monocrystalline metal film 12 and the piezoelectric substrate 10, and contains, as a main component, the constituent element of at least one of the monocrystalline metal film 12 and the piezoelectric substrate 10. Thus, the monocrystalline metal film 12 and the piezoelectric substrate 10 can be bonded at normal temperature. The main component is a component excluding the element used for activation in FIG. 5A (e.g., argon) and unintended impurities. For example, the amorphous layer 11 contains 50 atomic % or greater in total of the constituent elements (tantalum, lithium, oxygen, and molybdenum when the piezoelectric substrate 10 is a lithium tantalate substrate and the metal film 12 is made of molybdenum) of the piezoelectric substrate 10 and the metal film 12.

In the fourth variation of the first embodiment, the direction normal to the surface on which the comb-shaped electrodes 18 are located of the piezoelectric substrate 10 differs from the crystal axis orientation (the X-axis orientation, the Y-axis orientation, or the Z-axis orientation) of the monocrystalline metal film 12. The surface on which a pair of the comb-shaped electrodes 18 are located of the piezoelectric substrate 10 differs from the (001) plane when the monocrystalline metal film 12 has a body-centered cubic lattice crystal structure or a face-centered cubic lattice crystal structure, and differs from the (0001) plane when the monocrystalline metal film 12 has a hexagonal close-packed crystal structure. Thus, the power durability is further improved.

When the acoustic velocity of the surface acoustic wave excited by the IDT 20 is greater than the acoustic velocity of the bulk wave propagating through the piezoelectric substrate 10 (for example, the slowest shear bulk wave), the surface acoustic wave propagates through the surface of the piezoelectric substrate 10 while emitting the bulk wave. Thus, loss is generated. In particular, the acoustic velocity of the SH wave, which is a type of the surface acoustic wave, is greater than the acoustic velocity of the bulk wave. Thus, in the acoustic wave resonator in which the SH wave is used as a main mode, the loss is large. In the Y-cut X-propagation lithium tantalate substrate having a cut angle of 20° or greater and 48° or less, the SH wave is a main mode.

To reduce the acoustic velocity of the surface acoustic wave, a metal having a large acoustic impedance is used for the metal film 12. The acoustic impedance increases as the density and Young's modulus increase. A metal of higher atomic number has a greater density, and a harder metal has larger Young's modulus. Such metals are high-melting-point metals having a high melting point. As described above, when the high-melting-point metal is used for the metal film 12, the acoustic velocity of the surface acoustic wave is reduced, and the loss is thus reduced.

In addition, the high-melting-point metal has a large number of electrons and a small atomic radius. Thus, the high-melting-point metal has a strong metallic bond. Electromigration is a phenomenon that metallic atoms migrate due to an electric field. Stress migration is a phenomenon that metallic atoms migrate due to stress. Thus, these migrations hardly occur in the high-melting-point metal having a strong metallic bond. Thus, when the high-melting-point metal is used for the metal film 12, the migration is reduced.

For example, aluminum has a melting point of 660° C., a density of 2.7 g/cm$^3$, Young's modulus of 68 GPa, and an acoustic impedance of 8.3 GPa·s/m. Molybdenum, which is a high-melting-point metal, has a melting point of 2622° C., a density of 10.2 g/cm$^3$, Young's modulus of 329 GPa, and an acoustic impedance of 35.9 GPa's/m. As seen above, molybdenum has a melting point 2000° C. higher than that of aluminum, a density approximately four times that of aluminum, Young's modulus approximately five times that of aluminum, and an acoustic impedance approximately four times that of aluminum.

For example, iridium, molybdenum, rhenium, rhodium, ruthenium, and tungsten have melting points equal to or greater than 1774° C. that is the melting point of platinum, and densities equal to or greater than four times the density of Al.

As described above, the high-melting-point metals having a melting point higher than that of platinum have a large density and a high acoustic impedance. Thus, when these metals are used for the metal film 12, the acoustic velocity of the surface acoustic wave is reduced, and the loss is reduced. In addition, since the melting point is high, migration hardly occurs.

However, when the high-melting-point metal having a melting point equal to or higher than that of platinum is formed, as the electrode fingers 14, on the piezoelectric substrate 10, the crystal grains are likely to form a columnar structure regardless of whether vacuum evaporation or sputtering is used. The grain boundary is clear in the columnar structure. This is because the bond between crystal grains is weak and/or a gap is present between the crystal grains. In addition, the crystal grains have a uniform size, and are continuous in the stacking direction of the metal film 12. Thus, when large electric power is applied to the IDT 20, the metal film 12 easily breaks.

Thus, when a pair of the comb-shaped electrodes 18 is formed mainly of a metal having a melting point equal to or greater than the melting point of platinum, the comb-shaped electrodes 18 are formed mainly of the monocrystalline metal film 12. This configuration inhibits the breakage of the metal film 12, and improves the power durability.

Second Embodiment

Figure 11A:
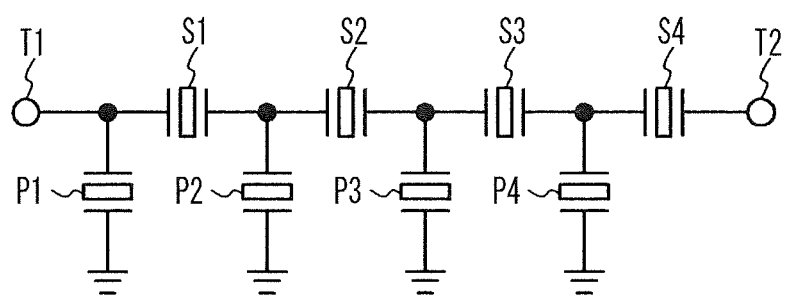
FIG. 11A is a circuit diagram of a filter in accordance with a second embodiment.

A second embodiment is an exemplary filter and an exemplary duplexer including the acoustic wave resonator of any one of the first embodiment and the variations thereof. FIG. 11A is a circuit diagram of a filter in accordance with the second embodiment. As illustrated in FIG. 11A, one or more series resonators S1 through S4 are connected in series between an input terminal T1 and an output terminal T2. One or more parallel resonators P1 through P4 are connected in parallel between the input terminal T1 and the output terminal T2. At least one of one or more series resonators S1 through S4 and one or more parallel resonators P1 through P4 may be the acoustic wave resonator according to any one of the first embodiment and the variations thereof. The number of series resonators and the number of parallel resonators in the ladder-type filter are freely selected. A ladder-type filter is described as an example of the filter, but the filter may be a multimode type filter.

Figure 11B:
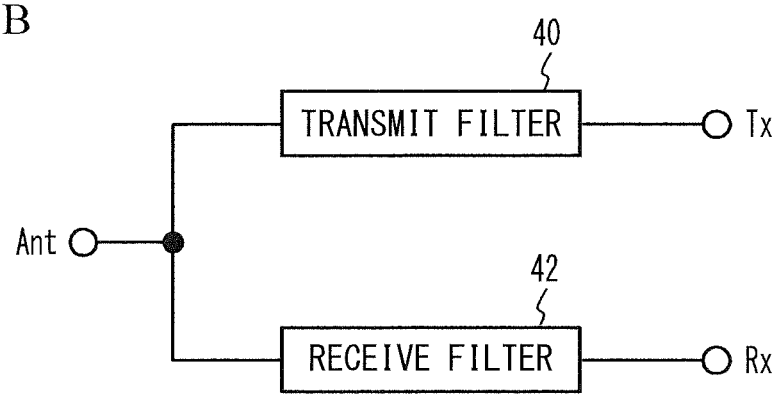
FIG. 11B is a circuit diagram of a duplexer in accordance with a first variation of the second embodiment.

FIG. 11B is a circuit diagram of a duplexer in accordance with a first variation of the second embodiment. As illustrated in FIG. 11B, a transmit filter 40 is connected between a common terminal Ant and a transmit terminal Tx. A receive filter 42 is connected between the common terminal Ant and a receive terminal Rx. The transmit filter 40 transmits, as transmission signals, signals in the transmit band to the common terminal Ant among high-frequency signals input from the transmit terminal Tx, and suppresses signals with other frequencies. The receive filter 42 transmits, as reception signals, signals in the receive band to the receive terminal Rx among high-frequency signals input from the common terminal Ant, and suppresses signals with other frequencies. At least one of the transmit filter 40 and the receive filter 42 may be the filter of the second embodiment.

A duplexer is described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. An acoustic wave device comprising:
a piezoelectric substrate;
a pair of comb-shaped electrodes located on the piezoelectric substrate, each of the comb-shaped electrodes being formed mainly of a monocrystalline metal film, each of the comb-shaped electrodes including electrode fingers, and
an amorphous layer that is in contact with the monocrystalline metal film and the piezoelectric substrate and is located between the monocrystalline metal film and the piezoelectric substrate, the amorphous layer containing, as a main component, a constituent element of at least one of the monocrystalline metal film and the piezoelectric substrate.

2. The acoustic wave device according to claim 1, wherein a direction normal to a surface on which the pair of comb-shaped electrodes is located of the piezoelectric substrate differs from a crystal axis orientation of the monocrystalline metal film.

3. The acoustic wave device according to claim 1, wherein a surface on which the pair of comb-shaped electrodes is located of the piezoelectric substrate differs from a (001) plane when the monocrystalline metal film has a body-centered cubic lattice crystal structure or a face-centered cubic lattice crystal structure, and differs from a (0001) plane when the monocrystalline metal film has a hexagonal close-packed crystal structure.

4. A filter comprising:
the acoustic wave device according to claim 1.

5. A multiplexer comprising:
the filter according to claim 4.

6. An acoustic wave device comprising:
a piezoelectric substrate;
a pair of comb-shaped electrodes located on the piezoelectric substrate, each of the comb-shaped electrodes being formed mainly of a monocrystalline metal film each of the comb-shaped electrodes including electrode fingers, and a bonding film that is in contact with the monocrystalline metal film and the piezoelectric substrate and is located between the monocrystalline metal film and the piezoelectric substrate, the bonding film containing, as a main component, an element different from a constituent element of the monocrystalline metal film and a constituent element of the piezoelectric substrate.

7. A filter comprising:
the acoustic wave device according to claim 6.

8. A multiplexer comprising:
the filter according to claim 7.

9. An acoustic wave device comprising:
a piezoelectric substrate;
a pair of comb-shaped electrodes located on the piezoelectric substrate, each of the comb-shaped electrodes being formed mainly of a monocrystalline metal film, each of the comb-shaped electrodes including electrode fingers, wherein
the monocrystalline metal film is made of a metal having a melting point equal to or greater than a melting point of platinum.

10. A filter comprising:
the acoustic wave device according to claim 9.

11. A multiplexer comprising:
the filter according to claim 10.

* * * * *